(12) United States Patent
Jo et al.

(10) Patent No.: US 11,451,253 B2
(45) Date of Patent: Sep. 20, 2022

(54) SIGNAL GENERATOR AND SIGNAL GENERATION METHOD

(71) Applicant: Nippon Telegraph and Telephone Corporation, Tokyo (JP)

(72) Inventors: Teruo Jo, Tokyo (JP); Munehiko Nagatani, Tokyo (JP); Hiroshi Hamada, Tokyo (JP); Hiroyuki Fukuyama, Tokyo (JP); Hideyuki Nosaka, Tokyo (JP); Hiroshi Yamazaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 79 days.

(21) Appl. No.: 17/053,237

(22) PCT Filed: Apr. 22, 2019

(86) PCT No.: PCT/JP2019/016943
§ 371 (c)(1),
(2) Date: Nov. 5, 2020

(87) PCT Pub. No.: WO2019/216168
PCT Pub. Date: Nov. 14, 2019

(65) Prior Publication Data
US 2021/0194523 A1 Jun. 24, 2021

(30) Foreign Application Priority Data

May 9, 2018 (JP) .............................. JP2018-090379

(51) Int. Cl.
*H04B 1/04* (2006.01)
*H03F 3/19* (2006.01)
(Continued)

(52) U.S. Cl.
CPC ............. *H04B 1/0483* (2013.01); *H03F 3/19* (2013.01); *H03F 3/24* (2013.01); *H03M 1/66* (2013.01);
(Continued)

(58) Field of Classification Search
CPC .................. H04B 1/0483; H04B 1/667; H04B 2001/0408; H04B 2001/0491;
(Continued)

(56) References Cited

U.S. PATENT DOCUMENTS 8,929,483 B1 * 1/2015 Mandell .................. H03F 3/195
455/114.3
9,438,178 B1 * 9/2016 Sulimarski ................ H03F 3/21
(Continued)

FOREIGN PATENT DOCUMENTS

JP       2018078403 A      5/2018
WO    WO-2014092617 A1 *  6/2014    ........... H03F 1/3247
WO    WO-2017084705 A1 *  5/2017    ............... G06G 7/19

OTHER PUBLICATIONS

Chen et al., "All-electronic 100-GHz Bandwidth Digital-to-AnalogConverter Generating PAM Signals up to 190-GBaud," OFC Postdeadline Papers, OSA, 2016, 3 pages.

*Primary Examiner* — Lana N Le
(74) *Attorney, Agent, or Firm* — Slater Matsil, LLP

(57) ABSTRACT

A digital signal process unit includes a first cancel signal generation unit and a second cancel signal generation unit. The first cancel signal generation unit generates, as a first cancel signal component, a cancel signal component corresponding to an image signal included in an analog signal output from a mixer. The second cancel signal generation unit generates, as a second cancel signal component, a cancel signal component corresponding to a leakage signal generated between an input and output of the mixer. The digital signal process unit includes subtractors for subtract- (Continued)

ing the first cancel signal component and the second cancel signal component from a signal component corresponding to a frequency band divided from an input signal to obtain a digital signal.

10 Claims, 10 Drawing Sheets

(51) Int. Cl.
    *H03F 3/24*     (2006.01)
    *H03M 1/66*     (2006.01)
    *H04B 1/66*     (2006.01)

(52) U.S. Cl.
    CPC ..... *H04B 1/667* (2013.01); *H04B 2001/0408* (2013.01); *H04B 2001/0491* (2013.01)

(58) Field of Classification Search
    CPC ........ H04B 10/50; H04B 1/525; H04B 1/406; H04B 1/40; H04B 1/0064; H04B 1/005; H04B 1/0028; H04B 1/0039; H04B 1/04; H04B 1/16; H04B 1/26; H04B 15/00; H04B 1/123; H04B 1/0475; H03F 3/19; H03F 3/24; H03F 3/211; H03F 2200/111; H03F 2200/429; H03F 2200/451; H03M 1/66; H03M 1/662

See application file for complete search history.

(56) References Cited

U.S. PATENT DOCUMENTS

| | | | |
|---|---|---|---|
| 9,641,206 B2* | 5/2017 | Pratt | H03F 1/3223 |
| 9,647,705 B2* | 5/2017 | Pack | H04B 15/02 |
| 10,897,228 B1* | 1/2021 | Nagarajan | H04B 1/406 |
| 11,057,123 B1* | 7/2021 | Chang | H04B 1/38 |
| 11,159,197 B2* | 10/2021 | Weissman | H04B 15/02 |
| 2003/0013426 A1* | 1/2003 | Kim | H03D 7/02 |
| | | | 455/196.1 |
| 2007/0097271 A1* | 5/2007 | Gao | H04B 1/123 |
| | | | 348/724 |
| 2013/0051212 A1* | 2/2013 | Suzuki | H04L 27/366 |
| | | | 375/296 |
| 2020/0266842 A1* | 8/2020 | Patel | H04B 1/04 |

* cited by examiner

SIGNAL GENERATOR AND SIGNAL GENERATION METHOD

CROSS-REFERENCE TO RELATED APPLICATIONS

This application is a national phase entry of PCT Application No. PCT/JP2019/016943, filed on Apr. 22, 2019, which claims priority to Japanese Application No. 2018-090379, filed on May 9, 2018, which applications are hereby incorporated herein by reference.

TECHNICAL FIELD

The present invention relates to a signal generator and a signal generation method for generating a broadband signal and, for example, relates to a signal generator and a signal generation method for generating one broadband signal from signals of a plurality of bands.

BACKGROUND

In recent years, with the increasing capacity of optical communication using optical fibers, there has been a demand for increasing the band of a baseband signal. For example, in an optical transmitter used in optical communication, data to be transmitted (digital signal) is converted into a broadband baseband signal (analog signal) by a digital-to-analog converter (hereinafter also referred to as "DAC"). Then, an optical signal corresponding to the baseband signal is generated and transmitted.

However, most of DACs used for generating baseband signals are manufactured by a complementary metal oxide semiconductor (CMOS) process for facilitating integration, which limits the increase in the band (the analog band by the CMOS process is reaching its peak at about 25 GHz at the moment). Accordingly, it has not been easy to generate a broadband baseband signal required in optical communication.

One known technique for solving such a problem is a frequency band synthesis technique. In the frequency band synthesis technique, an input signal (digital signal) including data to be transmitted is divided into a plurality of bands, and a plurality of analog signals individually converted by a plurality of DACs provided for each divided band are synthesized by carrying out frequency conversion stepwise by means of mixers, generating one broadband baseband signal as a desired signal (analog signal) (see Non-Patent Literature 1).

FIG. 7 is a view exemplifying a configuration of a signal generator to which a conventional frequency band synthesis technique is applied. FIG. 7 shows an example of including two DACs as the simplest example.

A signal generator 100 (100A) includes a digital signal process unit 10 (10A), DACs 11_1 and 11_2, a mixer (frequency converter) 12_2, a synthesizer 13, and a filter circuit 14_2 and generates a desired signal D(f) (analog signal) from an input signal Din (digital signal) including data to be transmitted.

In the signal generator 100A, when the desired signal D(f), or the analog signal D(f) having a desired frequency band to be finally output, is divided into two frequency bands $D_1(f)$ and $D_2(f)$, the digital signal process unit 10A divides a signal component of the input signal Din, generating two sets of digital signals $S_{D\_1}(f)$ and $S_{D\_2}(f)$ corresponding to the respective divided frequency bands $D_1(f)$ and $D_2(f)$.

The DACs 11_1 and 11_2 are provided so as to correspond to the two sets of digital signals $S_{D\_1}(f)$ and $S_{D\_2}(f)$ output from the digital signal process unit 10A, and convert the corresponding digital signals $S_{D\_1}(f)$ and $S_{D\_2}(f)$ into analog signals $S_1(f)$ and $S_2(f)$.

The mixer 12_2 multiplies the analog signal $S_2(f)$ from the DAC 11_2 by a local signal LO having a predetermined frequency f2 and thereby up-converts the analog signal $S_2(f)$ into an analog signal $S_{mix\_2}(f)$.

The analog signal $S_{mix\_2}(f)$ up-converted by the mixer 12_2 has an upper sideband wave and a lower sideband wave that are centered at the frequency f2. A signal of one of the upper sideband wave and the lower sideband wave does not need to be transmitted. In FIG. 7, one sideband wave that does not need to be transmitted (in this example, the lower sideband wave) is indicated by a "*" mark.

Thus, the subsequent stage of the mixer 12_2 is provided with the filter circuit 14_2, and the filter circuit 14_2 removes the one sideband wave (*) of the analog signal $S_{mix\_2}(f)$ from the mixer 12_2 as an image signal. Then, an analog signal $S_{flt\_2}(f)$ from which the image signal is removed is sent to the synthesizer 13. The synthesizer 13 synthesizes the analog signal $S_1(f)$ from the DAC 11_1 and the analog signal $S_{flt\_2}(f)$ from which the image signal is removed in the filter circuit 14_2, and thereby outputs the desired signal D(f).

CITATION LIST

Patent Literature

Patent Literature 1: Japanese Patent Application No. 2016-217832

Non-Patent Literature

Non-Patent Literature 1: Chen, Xi, et al. "All-electronic 100-GHz Bandwidth Digital-to-Analog Converter Generating PAM Signals up to 190-GBaud." OFC2016.

SUMMARY

Technical Problem

In the signal generator 100A shown in FIG. 7, it is ideal that the filter circuit 14_2 has a frequency characteristic that sharply attenuates at the cutoff frequency. However, in practice, the frequency characteristic attenuates with a certain degree of inclination at the cutoff frequency. Thus, the signal generator 100A has a problem in that the image signal cannot be appropriately removed, and the desired signal D(f) deteriorates.

It is also contemplated that, as in a signal generator 100 (100B) shown in FIG. 8, a guard band is provided between the upper sideband wave and lower sideband wave of the analog signal $S_{mix\_2}(f)$ up-converted by the mixer 12_2. In the signal generator 100B, the subsequent stage of the DAC 11_1 is also provided with a filter circuit 14_1. Furthermore, the upper sideband wave of the analog signal $S_{mix\_2}(f)$ up-converted by the mixer 12_2 is used as an image signal. However, the signal generator 100B has a problem in that the filter circuits 14_1 and 14_2 complicate the system configuration, and the guard band wastes the band of the DAC 11_2.

Thus, the present applicant has previously proposed a frequency band synthesis technique by a sideband canceling method in which the digital signal process unit generates a signal that cancels the image signal, thereby eliminating the filter circuit and generating a broadband signal with less deterioration (see Patent Literature 1).

An outline of the frequency band synthesis technique by the sideband canceling method will be explained with reference to FIG. 9. In a signal generator 100 (100C), a digital signal process unit 10 (10C) generates a cancel signal component corresponding to the image signal included in the analog signal S $_{mix\_2}$(f) and subtracts the generated cancel signal component from the signal component of the input signal Din corresponding to the frequency band D $_1$(f) to obtain the digital signal S $_{D\_1}$(f) to the DAC 11_1. Accordingly, when the synthesizer 13 synthesizes signals, the image signal included in the analog signal S $_{mix\_2}$(f) from the mixer 12_2 is canceled by the analog signal S $_1$(f) from the DAC 11_1.

However, in the signal generator 100C, the mixer 12_2 used as a circuit component has a leakage wave from an IF port to an RF port as shown in FIG. 10. The leakage wave is caused by difficulty in obtaining a large isolation at a portion where the bands of both ports overlap. That is, the low isolation characteristic in the mixer 12_2 generates the leakage wave between the input and output of the mixer 12_2. The leakage wave (hereinafter also referred to as a leakage signal) generated between the input and output of the mixer 12_2 causes deterioration at the time of synthesis in the synthesizer 13.

It is easily contemplated that a filter is used for canceling the leakage signal generated between the input and output of the mixer. However, a filter cannot be used for a portion where the band of the leakage wave (leakage signal) and the band of the lower sideband wave (image signal) overlap.

Embodiments of the present invention have been made to solve such problems, and an object thereof is to provide a signal generator and a signal generation method for canceling not only an image signal but also a signal leaked in a mixer (leakage signal) to generate a broadband signal with even less deterioration.

Means for Solving the Problem

To achieve such an object, embodiments of the present invention provide a signal generator (200A) configured to, using a digital signal as an input signal (Din), divide the input signal to obtain a plurality of divided signal components corresponding to a plurality of frequency bands, and generate an analog signal (D(f)) of a desired frequency band from the divided signal components, and the signal generator includes: a digital signal process (20A) configured to divide the input signal to obtain divided signal components corresponding to at least a first frequency band (D $_1$(f)) and a second frequency band (D $_2$(f)), and output the divided signal components as digital signals (S $_{D\_1}$(f), S $_{D\_2}$(f)) corresponding to the first frequency band and the second frequency band; a first digital-to-analog converter (11_1) configured to convert the digital signal corresponding to the first frequency band from the digital signal process unit into an analog signal (S $_1$(f)); a second digital-to-analog converter (11_2) configured to convert the digital signal corresponding to the second frequency band from the digital signal process unit into an analog signal (S $_2$(f)); a mixer (12_2) configured to output an analog signal (S $_{mix\_2}$(f)), the analog signal being obtained by multiplying the analog signal converted by the second digital-to-analog converter by a local signal (LO) of a predetermined frequency (f2); and a synthesizer (13) configured to synthesize the analog signal converted by the first digital-to-analog converter and the analog signal output from the mixer to output the analog signal of the desired frequency band (D(f)), wherein the digital signal process unit (20A) includes: a first cancel signal generation unit (24) configured to generate, as a first cancel signal component, a cancel signal component corresponding to an image signal included in the analog signal output from the mixer; a second cancel signal generation unit (25) configured to generate, as a second cancel signal component, a cancel signal component corresponding to a leakage signal included in the analog signal output from the mixer, the leakage signal being generated between an input and output of the mixer; and a subtractor (23_1, 23_2) configured to subtract the first cancel signal component and the second cancel signal component from the signal component corresponding to the first frequency band divided from the input signal to obtain the digital signal corresponding to the first frequency band to the first digital-to-analog converter.

In embodiments of the present invention, the digital signal process unit generates, as the first cancel signal component, the cancel signal component corresponding to the image signal included in the analog signal output from the mixer; generates, as the second cancel signal component, the cancel signal component corresponding to the leakage signal included in the analog signal output from the mixer, in which the leakage signal is generated between the input and output of the mixer; and subtracts the first cancel signal component and the second cancel signal component from the signal component corresponding to the first frequency band divided from the input signal to obtain the digital signal corresponding to the first frequency band to the first digital-to-analog converter. Thereby, when the synthesizer synthesizes signals, not only the image signal included in the analog signal from the mixer but also the leakage signal generated between the input and output of the mixer is cancelled.

In the above explanation, as an example, components in the drawings corresponding to those of embodiments of the present invention are indicated by reference numerals in parentheses.

Effects of Embodiments of the Invention

As explained above, according to embodiments of the present invention, the digital signal process unit generates, as the first cancel signal component, the cancel signal component corresponding to the image signal included in the analog signal output from the mixer; generates, as the second cancel signal component, the cancel signal component corresponding to the leakage signal included in the analog signal output from the mixer, in which the leakage signal is generated between the input and output of the mixer; and subtracts the first cancel signal component and the second cancel signal component from the signal component corresponding to the first frequency band divided from the input signal to obtain the digital signal corresponding to the first frequency band to the first digital-to-analog converter. Therefore, not only the image signal but also the signal leaked in the mixer (leakage signal) is cancelled, so that a broadband signal with even less deterioration can be generated.

DETAILED DESCRIPTION OF ILLUSTRATIVE EMBODIMENTS

Hereinafter, an embodiment of the present invention will be explained in detail with reference to the drawings.

Embodiment 1

Figure 1:
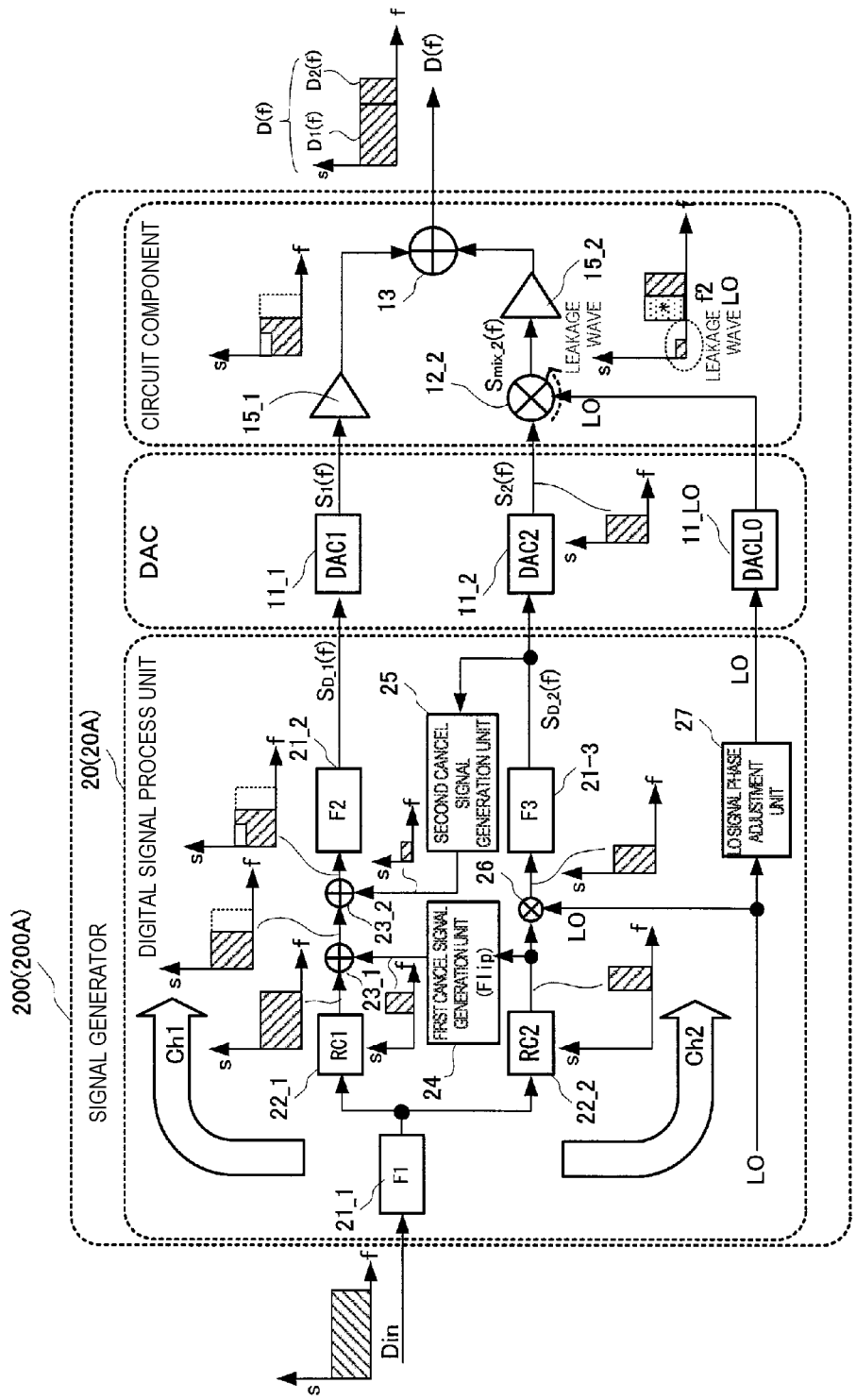
FIG. 1 is a view showing a configuration of a signal generator according to Embodiment 1 of the present invention.
Figure 9:
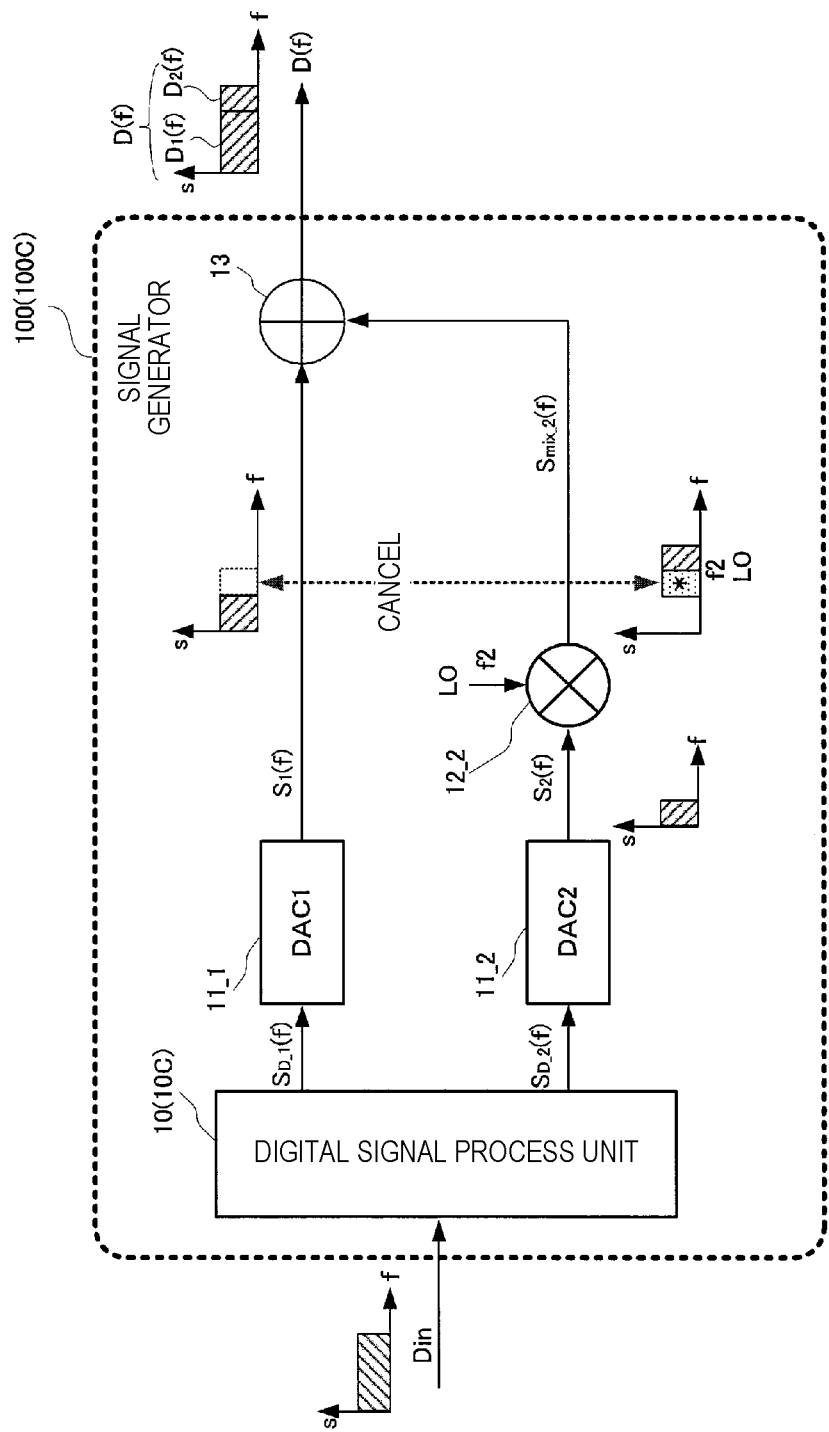
FIG. 9 is a view exemplifying a configuration of a signal generator to which a frequency band synthesis technique by a sideband canceling method that has been previously proposed by the present applicant is applied.
Figure 10:
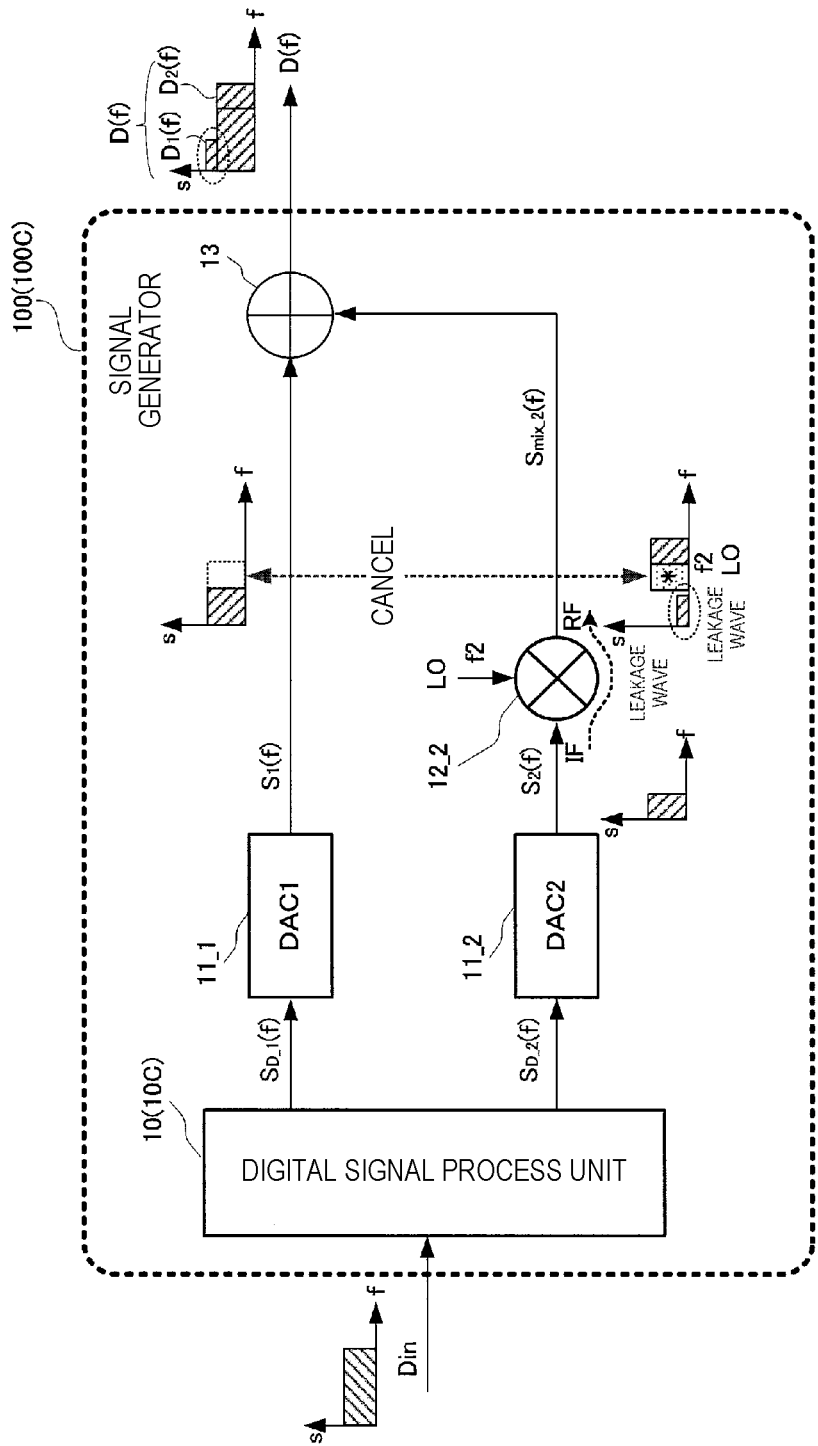
FIG. 10 is a view showing a leakage wave generated in a mixer of the signal generator to which the frequency band synthesis technique by the sideband canceling method is applied.

FIG. 1 is a view showing a configuration of a signal generator according to Embodiment 1 of the present invention. FIG. 1 shows the simplest example similarly to a signal generator 100C shown in FIG. 9.

A signal generator 200 (200A) of the present embodiment includes a digital signal process unit 20 (20A), DACs 11_1, 11_2, and 11_LO, a mixer (frequency converter) 12_2, a synthesizer 13, and amplifiers 15_1 and 15_2 and generates a desired signal D(f) (analog signal) from an input signal Din (digital signal) including data to be transmitted.

The signal generator 200A can be applied to, for example, an optical transmitter for optical communication system as a baseband signal generator that generates a broadband baseband signal from data to be transmitted. Hereinafter, a configuration of the signal generator 200A according to the present embodiment will be explained.

In the signal generator 200A, the digital signal process unit 20A is implemented through hardware including a processor and a storage device and a program that implements various functions in cooperation with the hardware. The digital signal process unit 20A includes filters 21_1 to 21_3, raised cosine filters 22_1 and 22_2, subtractors 23_1 and 23_2, a first cancel signal generation unit 24, a second cancel signal generation unit 25, a down converter mixer 26, and an LO signal phase adjustment unit 27. Furthermore, the mixer 12_2, the synthesizer 13, and the amplifiers 15_1 and 15_2 are provided as circuit components.

In the signal generator 200A, the digital signal process unit 20A divides a signal component of the input signal Din and generates two sets of digital signals $S_{D\_1}(f)$ and $S_{D\_2}(f)$. When the desired signal D(f), or the analog signal D(f) having a desired frequency band to be finally output, is divided into two frequency bands $D_1(f)$ and $D_2(f)$, the two sets of digital signals $S_{D\_1}(f)$ and $S_{D\_2}(f)$ correspond to the respective divided frequency bands $D_1(f)$ and $D_2(f)$.

The DACs 11_1 and 11_2 are provided so as to correspond to the two sets of digital signals $S_{D\_1}(f)$ and $S_{D\_2}(f)$ output from the digital signal process unit 20A, and convert the digital signals $S_{D\_1}(f)$ and $S_{D\_2}(f)$ into analog signals $S_1(f)$ and $S_2(f)$. Furthermore, the DAC 11_LO converts a local signal LO (digital signal) from the digital signal process unit 20A into an analog signal. The local signal LO converted into the analog signal is sent to the mixer 12_2.

In the digital signal process unit 20A, the filters 21_1 to 21_3 are provided so as to compensate for a frequency characteristic of the desired signal D(f) output from the synthesizer 13. The filter 21_2 is provided in a channel Ch1, which is a signal path on the side of the raised cosine filter 22_1. The filter 21_3 is provided in a channel Ch2, which is a signal path on the side of the raised cosine filter 22_2. The filter 21_1 is provided in a signal path before dividing into the signal path on the side of the channel Ch1 and the signal path on the side of the channel Ch2.

In the digital signal process unit 20A, the signal path on the side of the channel Ch1 is provided with the subtractors 23_1 and 23_2 between the raised cosine filter 22_1 and the filter 21_2. Furthermore, the signal path on the side of the channel Ch2 is provided with the down converter mixer 26 between the raised cosine filter 22_2 and the filter 21_3.

In the digital signal process unit 20A, the first cancel signal generation unit 24 is provided between an output line of the raised cosine filter 22_2 on the side of the channel Ch2 to the down converter mixer 26 and the subtractor 23_1 on the side of the channel Ch1. Furthermore, the second cancel signal generation unit 25 is provided between an output line of the filter 21_3 on the side of the channel Ch2 to the DAC 11_2 and the subtractor 23_2 on the side of the channel Ch1.

In the digital signal process unit 20A, the LO signal phase adjustment unit 27 adjusts a phase of the local signal LO (digital signal) to the DAC 11_LO so as to adjust a phase offset of the channel Ch1 and channel Ch2. The local signal LO (digital signal) in the digital signal process unit 20A is also sent to the down converter mixer 26. Hereinafter, processing in the digital signal process unit 20A will be explained with reference to functions of each unit.

In the digital signal process unit 20A, the input signal Din (digital signal) including data to be transmitted passes through the filter 21_1 and then enters the raised cosine filter 22_1 on the side of the channel Ch1 and the raised cosine filter 22_2 on the side of the channel Ch2. The filter 21_1 corrects a frequency characteristic of the input signal Din according to a predetermined characteristic so as to compensate for the frequency characteristic of the desired signal D(f) output from the synthesizer 13.

The raised cosine filter 22_1 on the side of the channel Ch1 separates a signal component corresponding to the frequency band $D_1(f)$ of the desired signal D(f) from the input signal Din. The separated signal component of the input signal Din corresponding to the frequency band $D_1(f)$ is sent to the subtractor 23_1.

The raised cosine filter 22_2 on the side of the channel Ch2 separates a signal component corresponding to the frequency band $D_2(f)$ of the desired signal D(f) from the input signal Din. The separated signal component of the input signal Din corresponding to the frequency band $D_2(f)$ is sent to the down converter mixer 26 and the first cancel signal generation unit 24.

The signal component corresponding to the frequency band $D_2(f)$ sent to the down converter mixer 26 is down-converted by the local signal LO (digital signal). For example, when the frequency band $D_2(f)$ is set to 25 to 40 GHz, the signal component is down-converted so as to correspond to 0 to 15 GHz. The down-converted signal component passes through the filter 21_3 and then, as the digital signal $S_{D\_2}(f)$, is sent to the DAC 11_2 and the second cancel signal generation unit 25. The filter 21_3 corrects a frequency characteristic of the signal from the down converter mixer 26 according to a predetermined characteristic so as to compensate for the frequency characteristic of the desired signal $D(f)$ output from the synthesizer 13.

The first cancel signal generation unit 24 receives the signal component corresponding to the frequency band $D_2(f)$ output from the raised cosine filter 22_2 on the side of the channel Ch2 and flips the signal component corresponding to the frequency band $D_2(f)$. Then, the first cancel signal generation unit 24 sends the resultant signal component to the subtractor 23_1 on the side of the channel Ch1. Here, the flipped signal component is used as a cancel signal component (first cancel signal component) corresponding to an image signal (lower sideband wave) included in the analog signal $S_{mix\_2}(f)$ output from the mixer 12_2, which is a circuit component. For example, when the frequency band $D_2(f)$ is set to 25 to 40 GHz, a complex conjugate signal centered at 25 GHz is generated, and as the first cancel signal component, a signal component corresponding to 10 to 25 GHz is sent to the subtractor 23_1 on the side of the channel Ch1.

The subtractor 23_1 subtracts the first cancel signal component from the first cancel signal generation unit 24 from the signal component corresponding to the frequency band $D_1(f)$ from the raised cosine filter 22_1. Thus, the signal component corresponding to the frequency band $D_1(f)$ from which the first cancel signal component is subtracted is sent from the subtractor 23_1 to the subtractor 23_2.

The second cancel signal generation unit 25 receives the digital signal $S_{D\_2}(f)$ to the DAC 11_2 and generates from the digital signal $S_{D\_2}(f)$ a signal component corresponding to a leakage signal generated between an input and output of the mixer 12_2, which is a circuit component. Then, the second cancel signal generation unit 25 sends the resultant signal component as a second cancel signal component to the subtractor 23_2 on the side of the channel Ch1.

In this example, the leakage signal generated between the input and output of the mixer 12_2 is observed in advance, and a signal component corresponding to the observed leakage signal is generated in the second cancel signal generation unit 25. Alternatively, the output of the mixer 12_2 may be fed back to the second cancel signal generation unit 25 to achieve more accurate correction.

The subtractor 23_2 subtracts the second cancel signal component from the second cancel signal generation unit 25 (the signal component corresponding to the leakage signal) from the signal component corresponding to the frequency band $D_1(f)$ from which the first cancel signal component from the subtractor 23_1 (the signal component corresponding to the image signal) is subtracted. Thus, the signal component corresponding to the frequency band $D_1(f)$ from which the first cancel signal component and the second cancel signal component are subtracted is output from the subtractor 23_2 and passes through the filter 21_2 to be thereafter sent as the digital signal $S_{D\_1}(f)$ to the DAC 11_1. The filter 21_2 corrects a frequency characteristic of the signal from the subtractor 23_2 according to a predetermined characteristic so as to compensate for the frequency characteristic of the desired signal $D(f)$ output from the synthesizer 13.

The DAC converts the digital signal $S_{D\_1}(f)$ from the digital signal process unit 20A into the analog signal $S_1(f)$. The analog signal $S_1(f)$ output from the DAC is sent to the synthesizer 13 through the amplifier 15_1. The DAC 11_2 converts the digital signal $S_{D\_2}(f)$ from the digital signal process unit 20A into the analog signal $S_2(f)$. The analog signal $S_2(f)$ output from the DAC 11_2 is sent to the mixer 12_2.

The mixer 12_2 multiplies the analog signal $S_2(f)$ from the DAC 11_2 by the local signal LO converted into an analog signal by the DAC LO from the digital signal process unit 20A and thereby up-converts the analog signal $S_2(f)$ into the analog signal $S_{mix\_2}(f)$.

Thus, for example, when a frequency f2 of the local signal LO is set to 25 GHz, the analog signal $S_{mix\_2}(f)$ has an upper sideband wave and a lower sideband wave (*) that are centered at the frequency f2 of the local signal LO=25 GHz. In this case, the lower sideband wave (*) is included in the analog signal $S_{mix\_2}(f)$ as an image signal. Furthermore, the analog signal $S_{mix\_2}(f)$ includes a leakage wave generated between the input and output of the mixer 12_2 as a leakage signal. The analog signal $S_{mix\_2}(f)$ including the image signal and the leakage signal is sent to the synthesizer 13 through the amplifier 15_2.

The synthesizer 13 synthesizes the analog signal $S_1(f)$ sent from the DAC 11 through the amplifier 15_1 and the analog signal $S_{mix\_2}(f)$ sent from the mixer 12_2 through the amplifier 15_2 and thereby outputs the desired signal $D(f)$. In this case, the analog signal $S_{mix\_2}(f)$ sent to the synthesizer 13 includes, as an image signal, the lower sideband wave (*) generated in the mixer 12_2 and, as a leakage signal, the leakage wave generated between the input and output of the mixer 12_2. On the other hand, in the digital signal process unit 20A, the signal components corresponding to the image signal and the leakage signal are subtracted from the analog signal $S_1(f)$ sent to the synthesizer 13. Accordingly, when the synthesizer 13 synthesizes signals, the image signal and the leakage signal are canceled.

Thus, according to the signal generator 200A of the present embodiment, not only the image signal generated in the mixer 12_2 but also the signal leaked in the mixer 12_2 (leakage signal) is canceled, so that a broadband signal with even less deterioration (desired signal $D(f)$) can be generated. Additionally, the amplifiers 15_1 and 15_2 have a role of not only amplifying signals but also providing an isolation for each of the channels Ch1 and Ch2.

Although in the present embodiment, the filters 21_1 to 21_3 are provided so as to compensate for the frequency characteristic of the desired signal $D(f)$ output from the synthesizer 13, the filters 21_1 to 21_3 may not be provided when the frequency characteristic of each circuit component is sufficiently flat. Furthermore, although in the present embodiment, the circuit components include the mixer 12_2, the synthesizer 13, and the amplifiers 15_1 and 15_2, the circuit components may not include the amplifiers 15_1 and 15_2 and may only include the mixer 12_2 and the synthesizer 13.

Furthermore, as in a signal generator 200 (200C) shown in FIG. 4 described later, an LO signal of 12.5 GHz may be doubled by a doubler 28 and sent as the local signal LO (digital signal) to the down converter mixer 26. Then, the LO signal of 12.5 GHz converted into an analog signal by the DAC 11_LO may be doubled by a doubler 29 and sent as the local signal LO to the mixer 12_2.

Experimental Results

Next, specific examples will be given to explain experimental results when a signal with a constant intensity having a frequency band of 0 to 40 GHz is output as the desired signal D(f).

Figure 2:
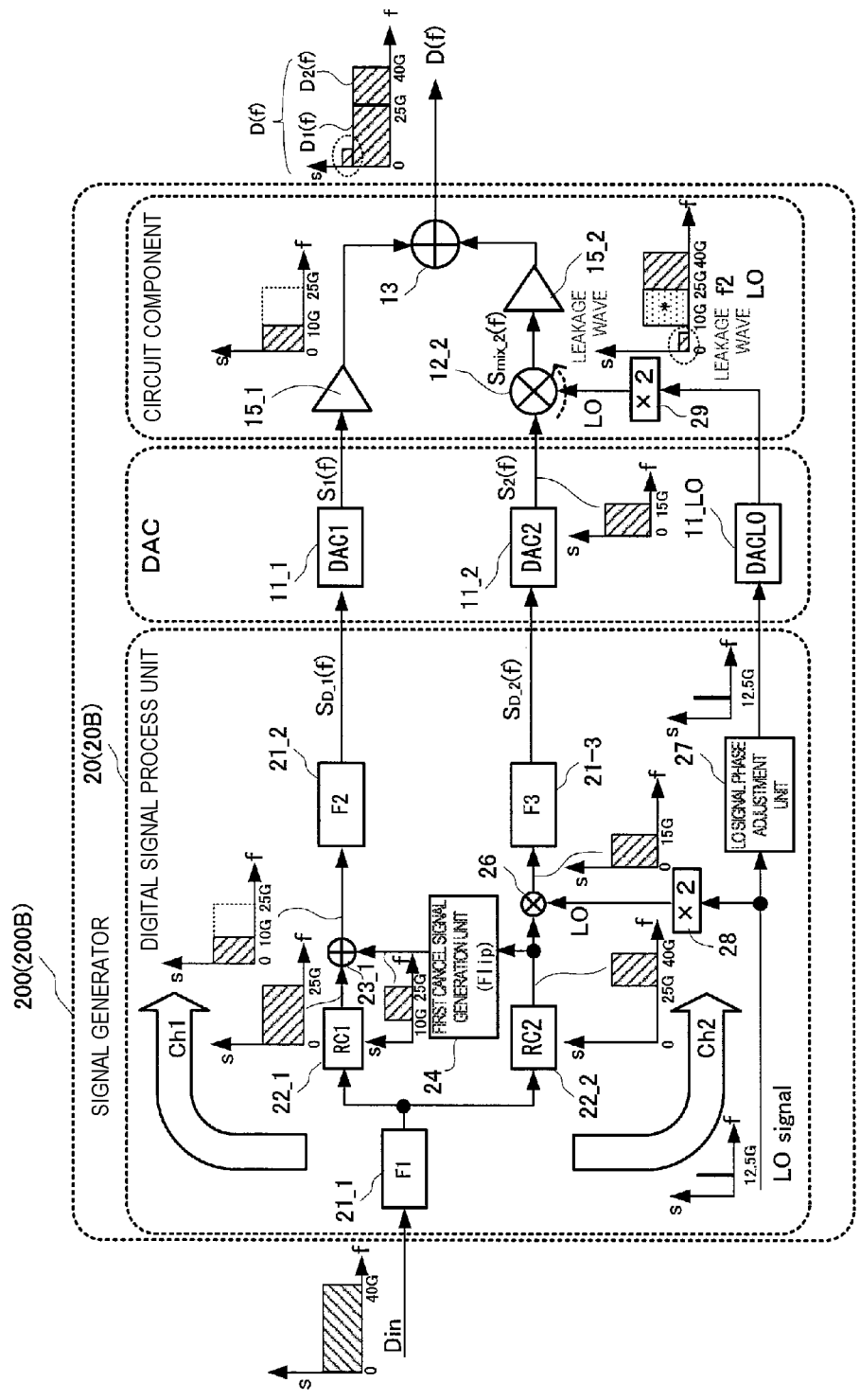
FIG. 2 is a view showing a specific example of a signal generator having no mechanism of canceling a leakage wave.

First, a signal generator 200 (200B) having no mechanism of canceling a leakage wave is shown in FIG. 2 as a specific example. The signal generator 200B uses the DACs 11_1, 11_2, and 11_LO having a bandwidth of 25 GHz.

Furthermore, in the signal generator 200B, the frequency band of the desired signal D(f) is set to 0 to 40 GHz. Then, in a digital signal process unit 20 (20B), in which the frequency band of 0 to 25 GHz is set to $D_1(f)$ and the frequency band of 25 to 40 GHz is set to $D_2(f)$, generates the digital signals $S_{D\_1}(f)$ and $S_{D\_2}(f)$ corresponding to the frequency bands $D_1(f)$ and $D_2(f)$.

Furthermore, the signal generator 200B uses a doubled LO signal of 12.5 GHz as the local signal LO to the down converter mixer 26 and the mixer 12_2. Thus, the LO signal of 12.5 GHz is doubled by the doubler 28 and sent to the down converter mixer 26 as the local signal LO (digital signal). Furthermore, the LO signal of 12.5 GHz converted into an analog signal by the DAC 11_LO is doubled by the doubler 29 and sent to the mixer 12_2 as the local signal LO.

Figure 3:
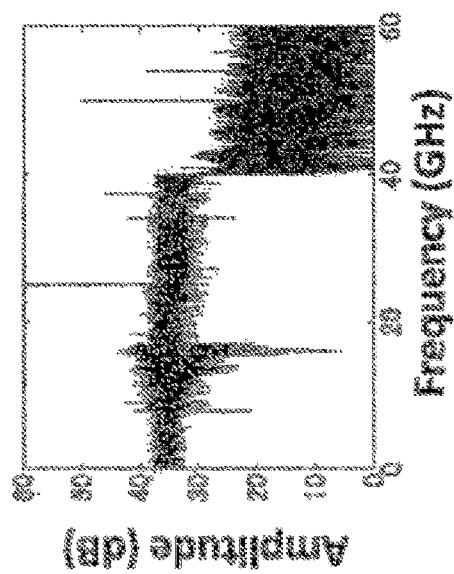
FIG. 3 is a view showing a frequency spectrum of an output signal in the signal generator shown in FIG. 2.

As an experimental result, a frequency spectrum of the desired signal D(f) output from the synthesizer 13 of the signal generator 200B is shown in FIG. 3. It can be understood that no fine desired signal D(f) is obtained due to the influence of the leakage wave at 10 to 15 GHz. In FIG. 4, the leakage wave (leakage signal) is shown at a position shifted from the actual band for easier understanding of its presence.

Figure 4:
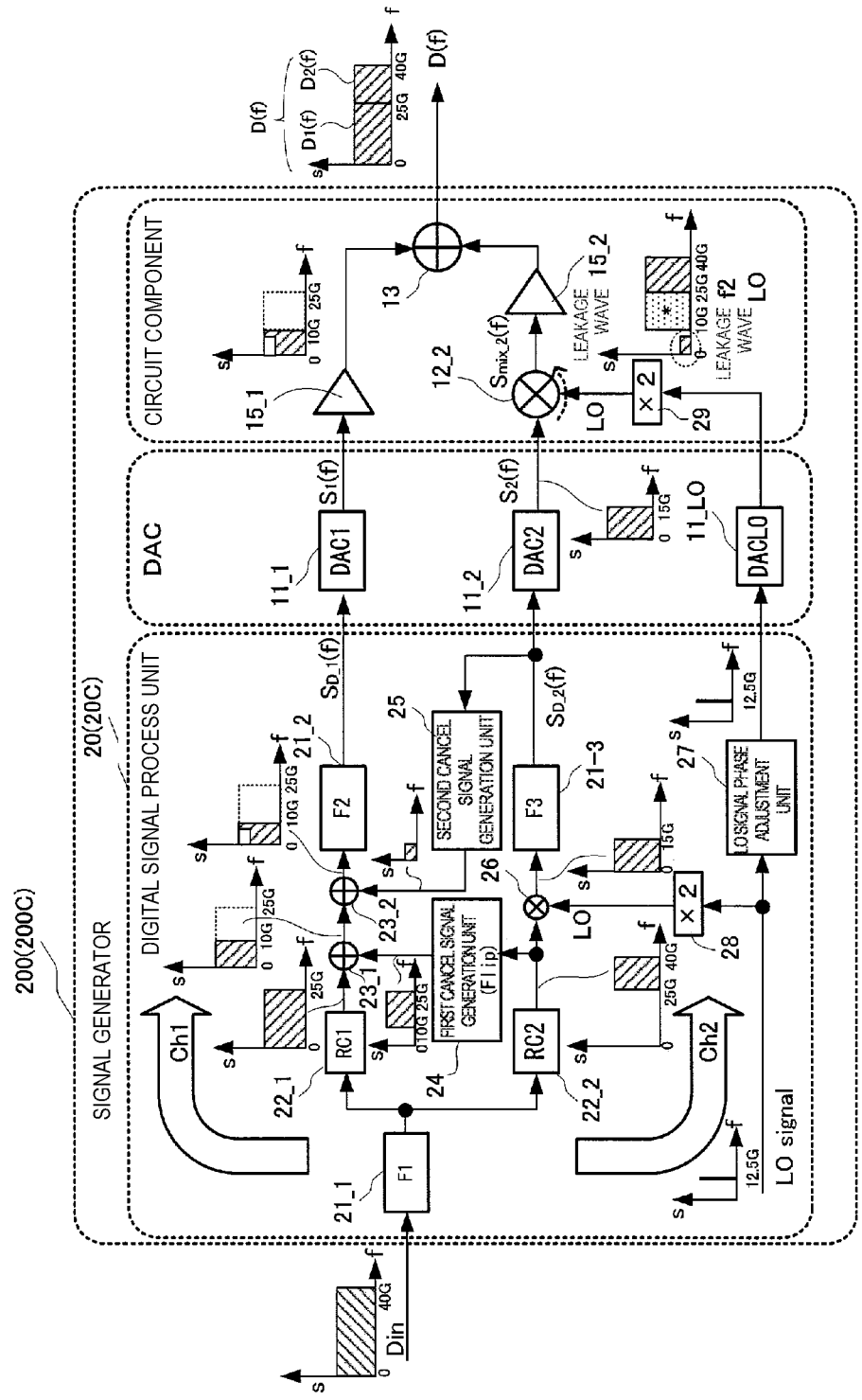
FIG. 4 is a view showing a specific example of a signal generator having a mechanism of canceling a leakage wave.

Next, the signal generator 200 (200C) having a mechanism of canceling a leakage wave is shown in FIG. 4 as a specific example. The signal generator 200C also uses the DACs 11_1, 11_2, and 11_LO having a bandwidth of 25 GHz, and other conditions thereof are also the same as those of the signal generator 200B shown in FIG. 2. On the other hand, the digital signal process unit 20 (20C) includes the second cancel signal generation unit 25 and the subtractor 23_2 for canceling a leakage wave.

Figure 5:
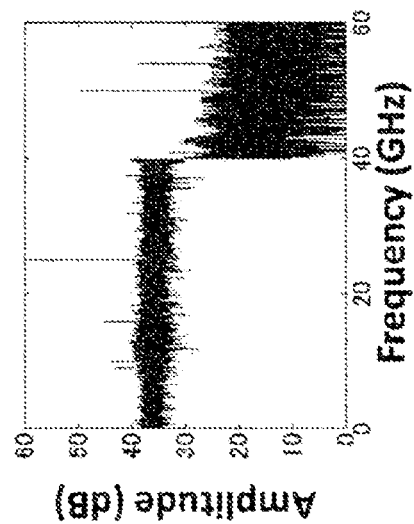
FIG. 5 is a view showing a frequency spectrum of an output signal in the signal generator shown in FIG. 4.

As an experimental result, a frequency spectrum of the desired signal D(f) output from the synthesizer 13 of the signal generator 200C is shown in FIG. 5. It can be understood that a leakage wave that strongly appears at 10 to 15 GHz is canceled and the fine desired signal D(f) is obtained. Similarly, in FIG. 5, the leakage wave (leakage signal) is shown at a position shifted from the actual band for easier understanding of its presence.

Embodiment 2

Although in FIG. 1, an example in which the frequency band of the desired signal D(f) is divided into two (two-channel configuration) is shown as the simplest example, three or more channels may be configured so as to further widen the frequency band of the desired signal D(f).

Figure 6:
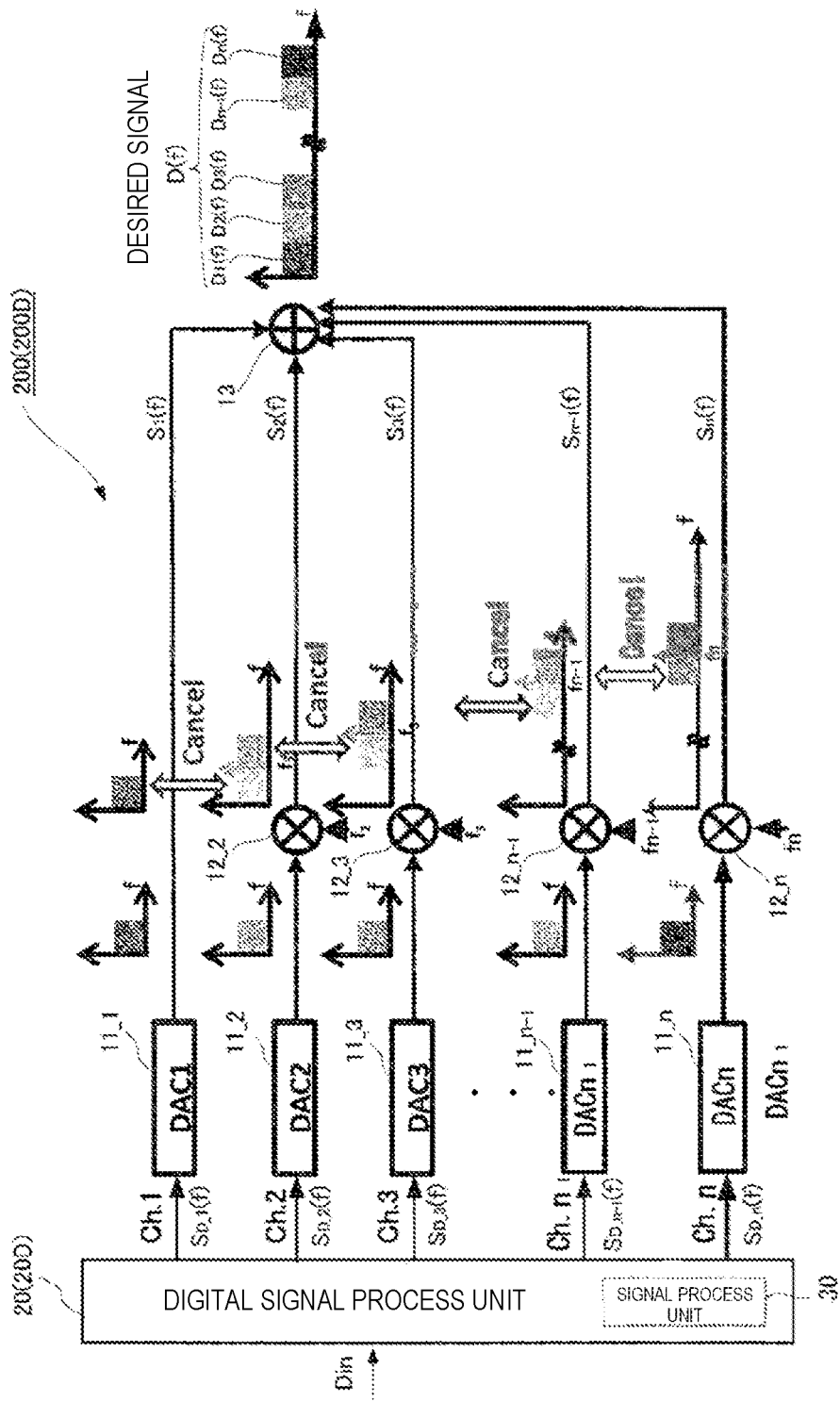
FIG. 6 is a view showing a configuration of a signal generator according to Embodiment 2 of the present invention.
Figure 7:
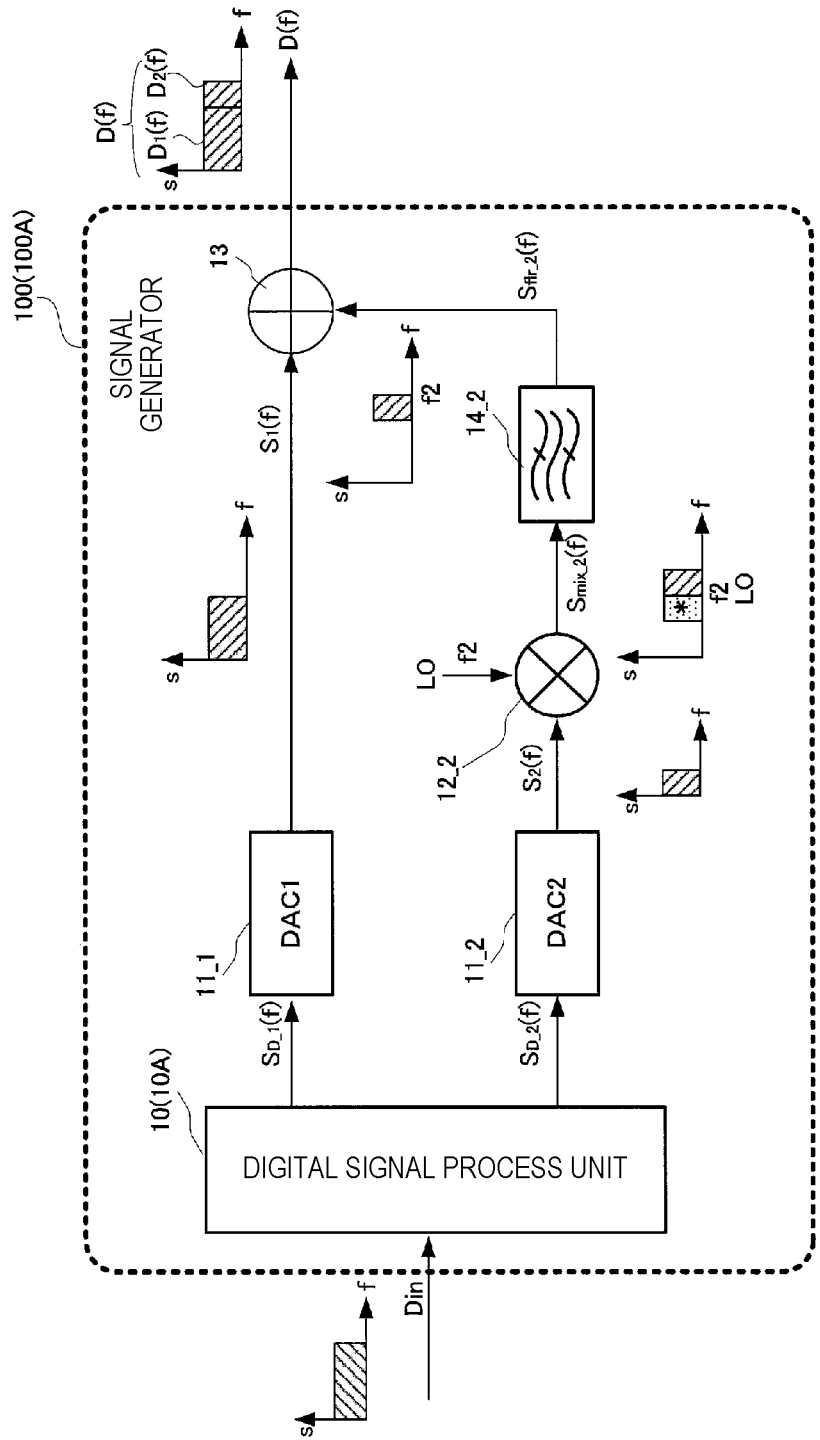
FIG. 7 is a view exemplifying a configuration of a signal generator to which a conventional frequency band synthesis technique is applied.
Figure 8:
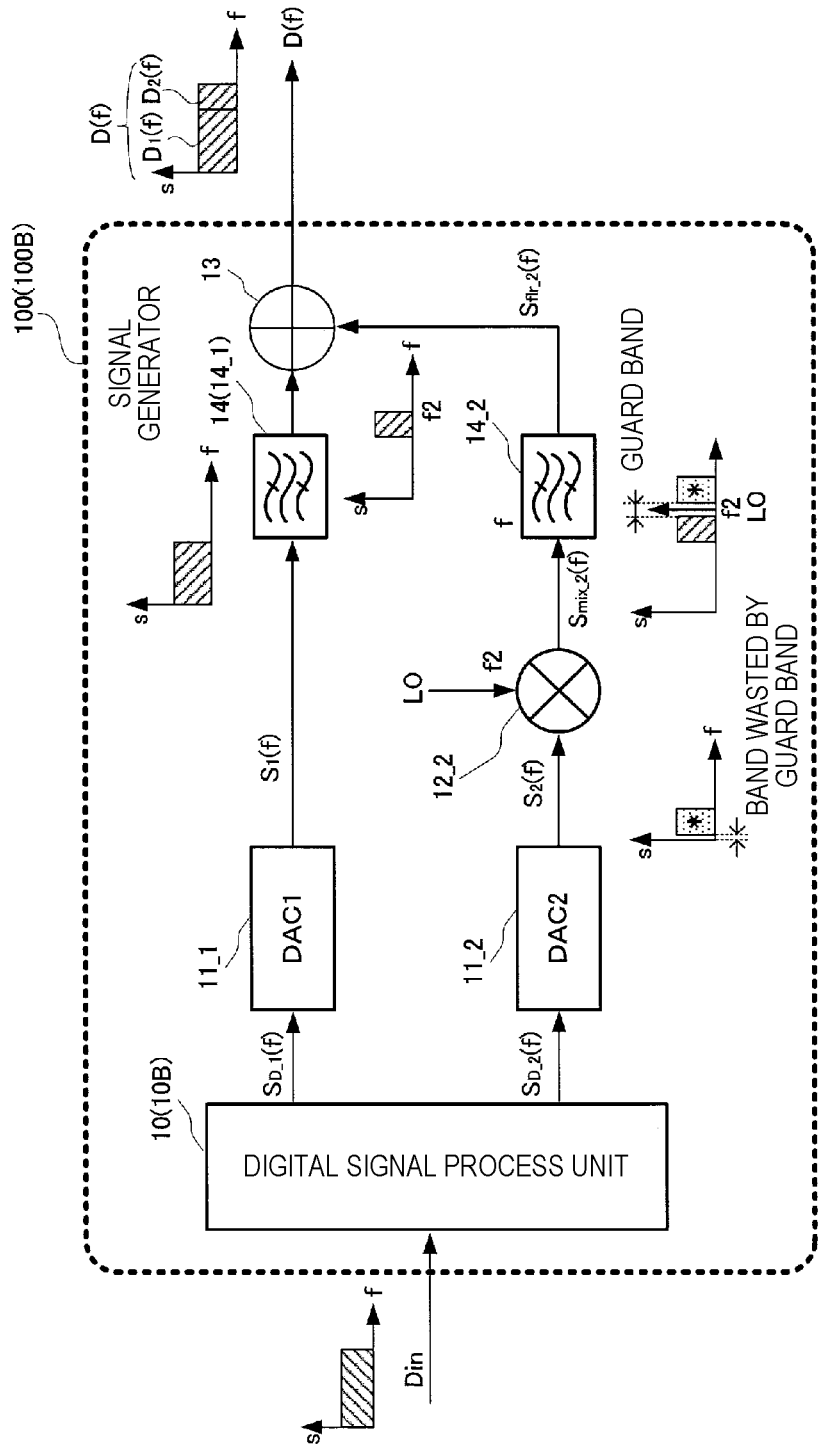
FIG. 8 is a view exemplifying a configuration of a signal generator including a guard band between an upper sideband wave and a lower sideband wave.

FIG. 6 shows an example of configuring three or more channels. In this example, a signal generator 200D includes n (n≥3) DACs 11_1 to 11_n corresponding to divided frequency bands and further includes (n−1) mixers 12_2 to 12_n corresponding to the DACs 11_2 to 11_n. Then, the synthesizer 13 synthesizes the analog signal $S_1(f)$ converted by the DAC 11_1 and analog signals $S_2(f)$ to $S_n(f)$ output from the mixers 12_2 to 12_n and thereby outputs an analog signal of a desired frequency band (desired signal D(f)).

In the signal generator 200 (200D), a digital signal process unit 20 (20D) includes a signal process unit 30. The signal process unit 30 generates cancel signal components corresponding to image signals included in the analog signals $S_2(f)$ to $S_n(f)$ output from the mixers 12_2 to 12_n and cancel signal components corresponding to leakage signals generated between inputs and outputs of the mixers 12_2 to 12_n. Then, the generated cancel signal components are subtracted from signal components corresponding to frequency bands $D_1(f)$ to $D_{n-1}(f)$ divided from the input signal Din to obtain digital signals $S_{D\_1}(f)$ to $S_{D\_{n-1}}(f)$ corresponding to the frequency bands $D_1(f)$ to $D_{n-1}(f)$ to DACs 11_1 to 11_$n_{-1}$.

Expansion of Embodiments

Although the present invention is explained as above with reference to the embodiments, the present invention is not limited to the above embodiments. The configurations and details in the present invention may be changed in a variety of ways, as can be understood by those skilled in the art, within the scope of the technical idea of the present invention.

REFERENCE SIGNS LIST

11_1 to 11_$n$ DAC
12_2 to 12_$n$ Mixer
13 Synthesizer
15_1, 15_2 Amplifier
20 (20A, 20D) Digital signal process unit
21_1 to 21_3 Filter
22_1, 22_2 Raised cosine filter
23_1, 23_2 Subtractor
24 First cancel signal generation unit
25 Second cancel signal generation unit
26 Down converter mixer
27 LO signal phase adjustment unit
28, 29 Doubler
30 Signal process unit
200 (200A, 200D) Signal generator.

The invention claimed is:
1. A signal generator, comprising:
a digital signal processor configured to:
   divide an input signal to obtain divided signal components corresponding to a first frequency band and a second frequency band, wherein the input signal is a digital signal; and
   output the divided signal components as a first digital signal corresponding to the first frequency band and a second digital signal corresponding to the second frequency band;
a first digital-to-analog converter configured to convert the first digital signal corresponding to the first frequency band into a first analog signal;
a second digital-to-analog converter configured to convert the second digital signal corresponding to the second frequency band into a second analog signal;
a mixer configured to output a third analog signal, the third analog signal being obtained by multiplying the second analog signal by a local signal of a predetermined frequency; and
a combiner configured to combine the first analog signal and the third analog signal to output a fourth analog signal of a desired frequency band; and wherein the digital signal processor comprises:
  a first cancel signal generator configured to generate a first cancel signal component corresponding to an image signal included in the third analog signal;
  a second cancel signal generator configured to generate a second cancel signal component corresponding to a leakage signal included in the third analog signal, the leakage signal being generated between an input of the mixer and output of the mixer; and
  a subtractor configured to subtract the first cancel signal component and the second cancel signal component from a first signal component of the divided signal components that correspond to the first frequency band divided to obtain the first digital signal corresponding to the first frequency band.

2. The signal generator according to claim 1, wherein:
the digital signal processor comprises:
  a first raised cosine filter configured to separate the first signal component corresponding to the first frequency band from the input signal;
  a second raised cosine filter configured to separate a second signal component corresponding to the second frequency band from the input signal; and
  a down converter mixer configured to down-convert the second signal component corresponding to the second frequency band; and
the subtractor comprises:
  a first subtractor configured to subtract the first cancel signal component from the first signal component corresponding to the first frequency band to obtain a third signal component; and
  a second subtractor configured to subtract the second cancel signal component from the third signal component.

3. The signal generator according to claim 2 further comprising:
  a first filter in a signal path before the signal path divides into a first signal path on a side of the first raised cosine filter and a second signal path on a side of the second raised cosine filter;
  a second filter in the signal path on the side of the first raised cosine filter; and
  a third filter in the signal path on the side of the second raised cosine filter, wherein the first filter, the second filter, and the third filter each compensate for a frequency characteristic of the fourth analog signal of the desired frequency band.

4. The signal generator according to claim 1 further comprising a local signal digital-to-analog converter configured to:
  convert a local signal from the digital signal processor into an analog signal; and
  send the local signal converted into the analog signal to the mixer.

5. The signal generator according to claim 4 further comprising
  an LO signal phase adjuster configured to adjust a phase of the local signal sent to the local signal digital-to-analog converter.

6. The signal generator according to claim 1 further comprising:
  a first amplifier configured to amplify the first analog signal sent to the combiner; and
  a second amplifier configured to amplify the third analog signal sent to the combiner.

7. A signal generator, comprising:
a digital signal processor configured to:
  divide an input signal to obtain divided signal components corresponding to n frequency bands, wherein the input signal is a digital signal, and wherein n is an integer greater than or equal to 3; and
  output the divided signal components as n digital signals corresponding to the n frequency bands, wherein each of the n digital signals corresponds to one of the n frequency bands;
a first digital-to-analog converter configured to convert a first digital signal of the n digital signals corresponding to a first frequency band of the n frequency bands into a first analog signal; and
a second to nth digital-to-analog converters configured to convert a second to nth digital signals of the n digital signals corresponding to a second to nth frequency bands of the n frequency bands into second analog signals;
first to (n−1)-th mixers configured to output third analog signals, the third analog signals being obtained by multiplying the second analog signals by a local signal of a predetermined frequency; and
a combiner configured to combine the first analog signal and the second analog signals to output a fourth analog signal of a desired frequency band; and
wherein the digital signal processor includes a signal processor configured to:
  generate first cancel signal components corresponding to image signals included in the third analog signals and second cancel signal components corresponding to leakage signals generated between inputs and outputs of the second to n-th mixers; and
  subtract the first cancel signal components and the second cancel signal components from signal components of the divided signal components that correspond to the first to (n−1)-th frequency bands of the n frequency bands to obtain digital signals of the n digital signals corresponding to the first to (n−1)-th frequency bands, wherein the first to (n−1)-th frequency bands are sent to the first to (n−1)-th digital-to-analog converters.

8. A signal generation method comprising:
dividing a input signal to obtain divided signal components corresponding to a first frequency band and a second frequency band, wherein the input signal is a digital signal;
outputting the divided signal components as a first digital signal corresponding to the first frequency band and a second digital signal corresponding to the second frequency band;
converting, by a first digital-to-analog converter, the first digital signal corresponding to the first frequency band into a first analog signal;
converting, by a second digital-to-analog converter, the second digital signal corresponding to the second frequency band into a second analog signal;
multiplying, by a mixer, the second analog signal by a local signal of a predetermined frequency to obtain a third analog signal; and
combining the first analog signal converted by the first digital-to-analog converter and the third analog signal to output a fourth analog signal of a desired frequency band,
wherein dividing the input signal to obtain divided signal components corresponding to a first frequency band and a second frequency band and outputting the divided signal components as the first digital signal corresponding to the first frequency band and the second digital signal corresponding to the second frequency band comprises:

generating a first cancel signal component;

generating a second cancel signal component different from the first cancel signal component; and subtracting the first cancel signal component and the second cancel signal component from a first signal component of the divided signal components that corresponds to the first frequency band to obtain the first digital signal corresponding to the first frequency band.

9. The method according to claim 8, wherein the first cancel signal component corresponds to an image signal included in the third analog signal.

10. The method according to claim 8, wherein the second cancel signal component corresponds to a leakage signal included in the third analog signal, the leakage signal being generated between an input and output of the mixer.

* * * * *